US012809339B2

United States Patent
(12) United States Patent
Mathewson et al.

(10) Patent No.: US 12,809,339 B2
(45) Date of Patent: Nov. 24, 2026

(54) INTEGRATED SERVO SYSTEMS AND APPARATUSES FOR CONTROLLING QUANTUM COMPUTING OPERATIONS

(71) Applicant: Quantinuum LLC, Broomfield, CO (US)

(72) Inventors: Brian Mathewson, Denver, CO (US); Paul Blanchard, Westminster, CO (US); Leonardo Ascarrunz, Lafayette, CO (US); Aaron Hankin, Arvada, CO (US)

(73) Assignee: Quantinuum LLC, Broomfield, CO (US)

( * ) Notice: Subject to any disclaimer, the term of this patent is extended or adjusted under 35 U.S.C. 154(b) by 578 days.

(21) Appl. No.: 18/094,661

(22) Filed: Jan. 9, 2023

(65) Prior Publication Data

US 2024/0085883 A1 Mar. 14, 2024

Related U.S. Application Data

(60) Provisional application No. 63/306,261, filed on Feb. 3, 2022.

(51) Int. Cl.
*G05B 19/4155* (2006.01)
*G05B 19/4062* (2006.01)
(Continued)

(52) U.S. Cl.
CPC ...... *G05B 19/4155* (2013.01); *G05B 19/4062* (2013.01); *G05B 2219/34013* (2013.01); *H01S 3/0085* (2013.01); *H01S 5/06* (2013.01)

(58) Field of Classification Search
CPC ............ G05B 19/4155; G05B 19/4062; G05B 2219/34013; H01S 3/0085; H01S 5/06
See application file for complete search history.

(56) References Cited

U.S. PATENT DOCUMENTS 6,566,948 B1 * 5/2003 Braithwaite .......... H03F 1/3247 330/136
10,504,033 B1 12/2019 King et al.
(Continued)

FOREIGN PATENT DOCUMENTS

JP 2022-507107 A 1/2022

OTHER PUBLICATIONS

T. Feldker, "Compact Ion-Trap Quantum Computing Demonstrator", Jun. 2021, Online URL:<https://journals.aps.org/prxquantum/abstract/10.1103/PRXQuantum.2.020343> (Year: 2021).*
(Continued)

*Primary Examiner* — Jonathan Michael Skrzycki
(74) *Attorney, Agent, or Firm* — Alston & Bird LLP

(57) ABSTRACT

Embodiments of the present disclosure provide for a quantum computing system with one or more integrated servo systems. In some embodiments, the one or more integrated servo systems may be dynamically tuned or adjusted, which may provide for reduction of noise and improvement of timing of execution of quantum operations in the quantum computing system. In some embodiments, the integrated servo systems may be configured to use closed loop control system to tune the integrated servo systems. In some embodiments, the integrated servo systems may be configured for live streaming to operators through a plurality of operations.

22 Claims, 7 Drawing Sheets

(51) Int. Cl.

| | |
|---|---|
| *H01S 3/00* | (2006.01) |
| *H01S 5/06* | (2006.01) |

(56) References Cited

U.S. PATENT DOCUMENTS

| | | | | |
|---|---|---|---|---|
| 10,951,002 | B1 * | 3/2021 | Bohn | H01S 3/0085 |
| 2003/0056147 | A1 * | 3/2003 | Yutkowitz | G05B 11/28<br>714/25 |
| 2007/0030176 | A1 * | 2/2007 | Sanchez-Olea | H01S 5/0014<br>341/13 |
| 2016/0254866 | A1 * | 9/2016 | Blumenthal | H04B 10/5057<br>398/197 |
| 2018/0173027 | A1 | 6/2018 | Morse et al. | |
| 2018/0203265 | A1 * | 7/2018 | Morse | G02F 1/113 |
| 2019/0049495 | A1 * | 2/2019 | Ofek | G06N 10/70 |
| 2020/0175411 | A1 * | 6/2020 | King | G06N 20/20 |
| 2020/0295525 | A1 * | 9/2020 | Maker | H01S 3/1312 |

OTHER PUBLICATIONS

B. Keitch, "Programmable and scalable radio-frequency pulse sequence generator for multi-qubit quantum information experiments" , 2017, Online URL:<https://arxiv.org/abs/1710.04282> (Year: 2017).*

Bardin, Joseph C., et al., "Microwaves in Quantum Computing", IEEE Journal of Microwaves, Jan. 11, 2021, pp. 403-427, vol. 1, No. 1, IEEE, US.

Outgoing—ISA/210—International Search Report Mailed on Apr. 5, 2024 for WO Application No. PCT/US23/012135, 4 page(s).

Outgoing Written Opinion of the ISA Mailed on Apr. 5, 2024 for WO Application No. PCT/US23/012135, 7 page(s).

English Translation of JP Office Action, including Search Report dated Jul. 29, 2025 for JP Application No. 2024546177, 15 page(s).

JP Office Action, including Search Report Mailed on Jul. 29, 2025 for JP Application No. 2024546177, 11 page(s).

English translation of JP Decision to Grant dated Dec. 2, 2025 for JP Application No. 2024546177, 2 page(s).

JP Decision to Grant Mailed on Dec. 2, 2025 for JP Application No. 2024546177, 3 page(s).

* cited by examiner

INTEGRATED SERVO SYSTEMS AND APPARATUSES FOR CONTROLLING QUANTUM COMPUTING OPERATIONS

CROSS-REFERENCE TO RELATED APPLICATIONS

This application claims the benefit of U.S. Provisional Patent Application Ser. No. 63/306,261, filed on Feb. 3, 2022, the entire contents of which are incorporated by reference herein for all purposes.

TECHNOLOGICAL FIELD

Embodiments of the present disclosure generally relate to quantum computing systems, including integrated servo systems or apparatuses for controlling quantum computing operations.

BACKGROUND

Quantum computers require a large number of subsystems/components, including electronics, optics, sensors, mechanical devices, and controls (e.g., for temperature control). Such subsystems/components must be precisely controlled and coordinated to perform quantum computation, such as with the execution of a plurality of quantum operations. For example, in various atomic systems, for the execution of quantum operations it is important to be able to deliver laser beams to the system at particular positions, frequencies, phases and/or times in order to complete various functions, such as implementing logic gates. The subsystems/components often generate noise, which is detrimental to the operation of the quantum computer. Conventional subsystems/components may also take longer to execute, which may be detrimental to executing quantum operations due to atomic objects used as qubits decaying from a desired state to an undesired state.

Quantum computers are predicted to have increased demands in regard to tighter tolerances, such as for noise and timing. Current industry practice is to use a large number of discrete servo system/units for closed loop control of subsystems/components. There are limitations in using discrete servos, which are impractical due to performance, including noise generated, quantity, size, timing, and challenges related to integrating with other components for closed loop control. As described herein, the Applicant has discovered problems with current implementations of quantum computing systems, including problems with discrete servos. Through applied effort, ingenuity, and innovation, Applicant has solved many of these identified problems in the various implementations and solutions embodied in the present disclosure, which are described in detail below.

BRIEF SUMMARY

In general, embodiments of the present disclosure provided herein provide for an improved a quantum computing environment (e.g., a quantum charge-coupled device (QCCD) quantum computing environment). Such an improved quantum computing environment includes an integrated servo system that improves the overall execution of the quantum program by reducing noise in the quantum computing environment, including during the execution of calibration routines and of quantum programs, by integrating one or more servo systems or apparatuses into the closed loop control system, and by allowing for greater precision in timing of executing quantum operations. Other implementations will be, or will become, apparent to one with skill in the art upon examination of the following figures and detailed description. It is intended that all such additional implementations be included within this description be within the scope of the disclosure and be protected by the following claims.

In accordance with one aspect of the disclosure, a quantum computer system is provided. The quantum computer system includes a laser source configured to generate a laser beam; a modulator configured to receive the laser beam, to receive a servo control signal, and to modulate the laser beam to generate a modulated laser beam based on the laser beam and the servo control signal; a sensor configured to receive the modulated laser beam, detect an intensity of the modulated laser beam, and generate a sensor control signal based on the intensity of the modulated laser beam; and an integrated servo system, wherein the integrated servo system is configured to receive the sensor control signal and produce the servo control signal based at least in part on the sensor control signal.

Additionally or alternatively, in some embodiments the quantum computer system includes a control system chassis, and wherein the integrated servo system is mounted in the control system chassis.

Additionally or alternatively, in some embodiments of the quantum computer system, the integrated servo system is associated with one or more servo channels, and wherein each of the servo channels are on a common printed circuit board (PCB).

Additionally or alternatively, in some embodiments of the quantum computer system, the integrated servo system is associated with one or more servo channels, and wherein the servo channels are on a PCB and a daughter PCB.

Additionally or alternatively, in some embodiments of the quantum computer system, the integrated servo system further comprises one or more direct digital synthesis (DDS) devices, wherein each DDS device is configured to generate a servo control signal based on a noise measurement from a sensor control signal.

Additionally or alternatively, in some embodiments of the quantum computer system, the integrated servo system is further configured to receive servo configuration data from a servo configuration database and to load one or more settings of one or more integrated servo system components with a setting based on the servo configuration data.

Additionally or alternatively, in some embodiments of the quantum computer system includes a controller configured to live-stream integrated servo system data; and a user device configured to receive integrated servo system data from the live stream and display the servo data.

In accordance with another aspect of the present disclosure a quantum computer system is provided, and the quantum computer system includes a first laser source and a second laser source, wherein the first laser source is configured to generate a first laser beam and the second laser source is configured to generate a second laser beam; a first modulator and a second modulator, wherein the first modulator is associated with the first laser source and the second modulator is associated with the second laser source, wherein the first modulator is configured to receive the first laser beam, to receive a first servo control signal, and to modulate the first laser beam to generate a first modulated laser beam based on the first laser beam and the first servo control signal, wherein the second modulator is configured to receive the second laser beam, to receive a second servo control signal, and to modulate the second laser beam to generate a second modulated laser beam based on the second laser beam and the second servo control signal; a first sensor and a second sensor, wherein the first sensor is configured to receive the first modulated laser beam, detect a first intensity of the first modulated laser beam, and generate a first sensor control signal based on the first intensity of the first modulated laser beam, and wherein the second sensor is configured to receive the second modulated laser beam, detect a second intensity of the second modulated laser beam, and generate a second sensor control signal based on the second intensity of the second modulated laser beam; and a first integrated servo system configured to receive the first sensor control signal and generate the first servo control signal based on the first sensor control signal; a second integrated servo system configured to receive the second sensor control signal and generate the second servo control signal based on the second sensor control signal.

Additionally or alternatively, in some embodiments of the quantum computer system, the quantum computer system includes a control system chassis, and wherein the first integrated servo system and second integrated servo system are mounted in the control system chassis.

Additionally or alternatively, in some embodiments of the quantum computer system, the first integrated servo system and second integrated servo system are mounted on one PCB.

Additionally or alternatively, in some embodiments of the quantum computer system, the first integrated servo system further includes a first DDS, wherein the first DDS is configured to generate the first servo control signal based on a first noise measurement from a first sensor control signal, and wherein the second integrated servo system further comprising: a second DDS, wherein the second DDS is configured to generate the second servo control signal based on a second noise measurement from a second sensor control signal.

Additionally or alternatively, in some embodiments of the quantum computer system, the first integrated servo system and the second integrated servo system are further configured to receive servo configuration data from a servo configuration database and to load one or more settings of one or more integrated servo system components with a setting based on the servo configuration data.

Additionally or alternatively, in some embodiments of the quantum computer system further includes a controller configured to live-stream integrated servo system data received from the integrated servo system and the second integrated servo system; a user device configured to receive the integrated servo system data from the live stream and display the servo data.

In accordance with another aspect of the present disclosure a quantum computer system is provided, and the quantum computer system includes an integrated servo system, wherein the integrated servo system is configured to receive a sensor control signal from a sensor, produce a servo control signal based on the sensor control signal, and to transmit a plurality of integrated servo system data settings; a laser source configured to generate a laser beam; a modulator configured to receive the laser beam and the servo control signal and to modulate the laser beam to generate a modulated laser beam based on the laser beam and the servo control signal; and a controller comprising the integrated servo system wherein the controller is configured to transmit the integrated servo system data settings to a computing entity.

Additionally or alternatively, in some embodiments of the quantum computer system, transmitting the integrated servo system data settings to a computing entity comprises generating a graphical representation of an alert associated with the integrated servo system data settings and transmitting the alert for display.

BRIEF DESCRIPTION OF THE DRAWINGS

Having thus described various embodiments of the disclosure in general terms, reference is now made to the accompanying drawings, which are not necessarily drawn to scale.

Figure 1:
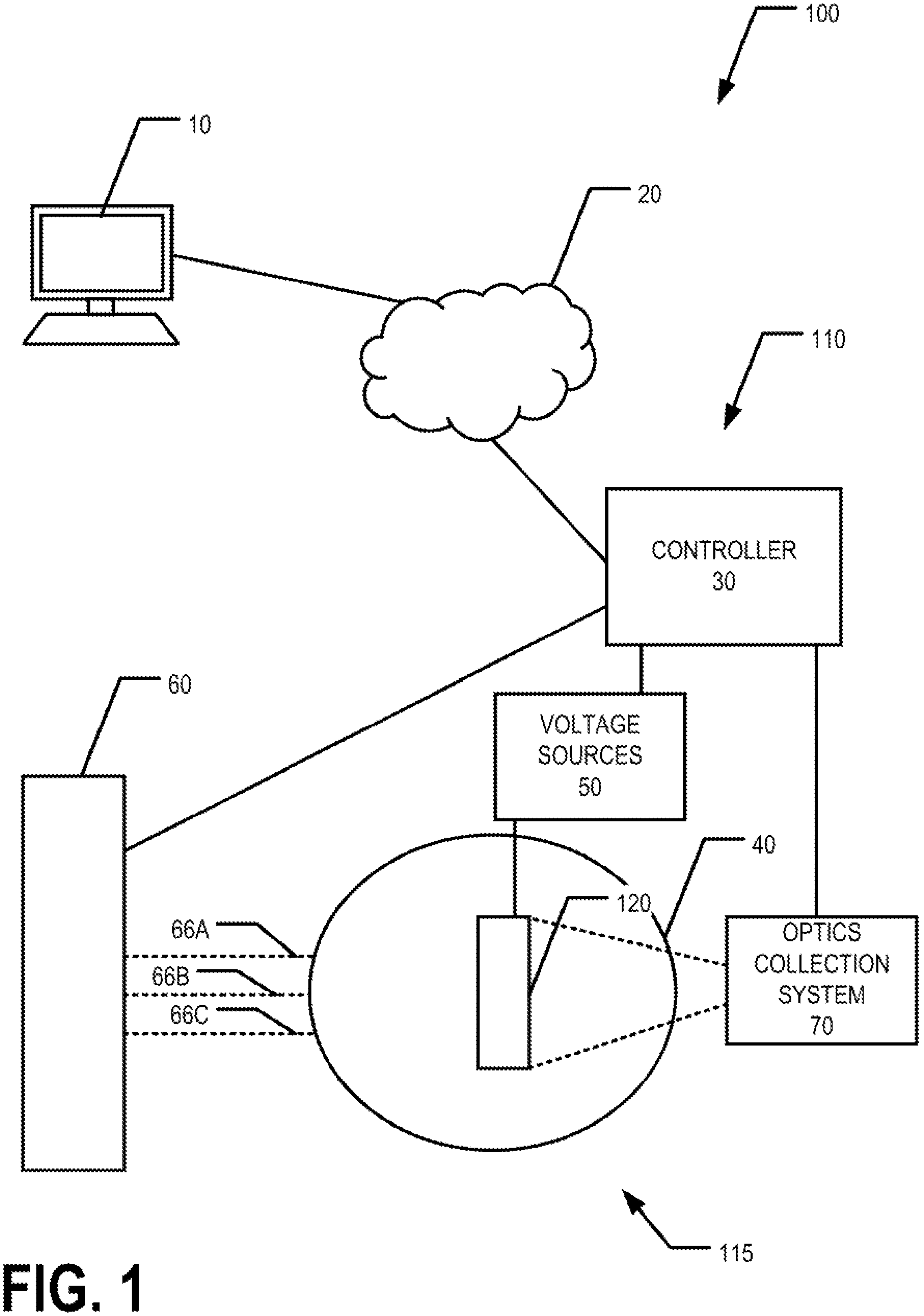

FIG. 1 is a schematic diagram illustrating an example quantum computing system comprising a quantum system controller according an example embodiment.

Figure 2:
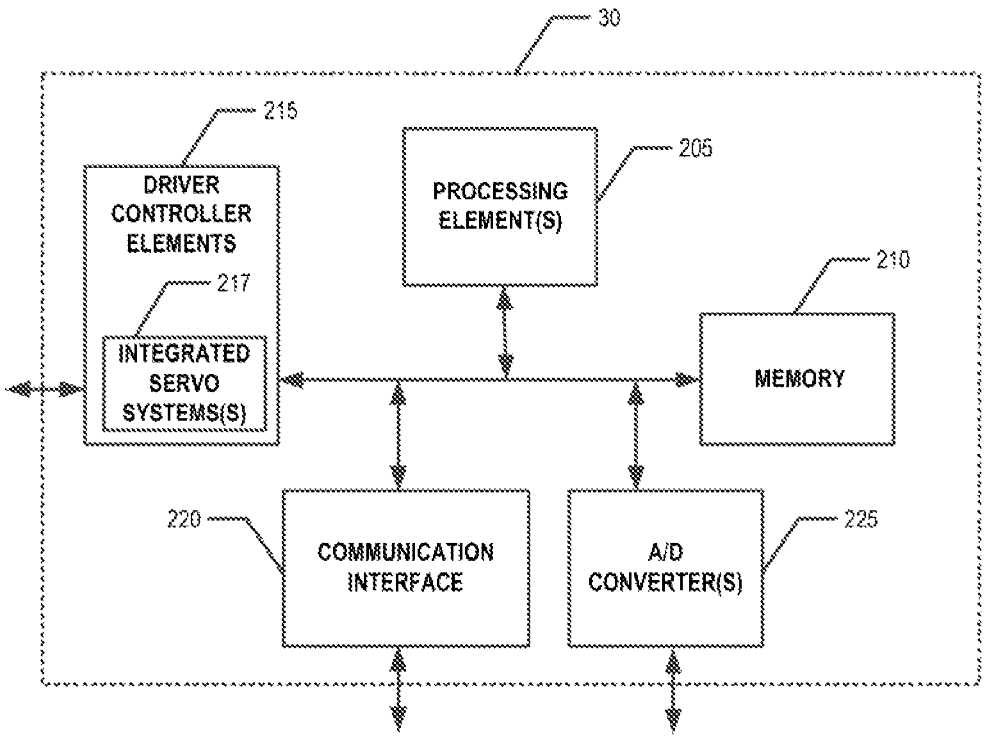

FIG. 2 is a schematic diagram of an example quantum system controller of a quantum computer.

Figure 3:
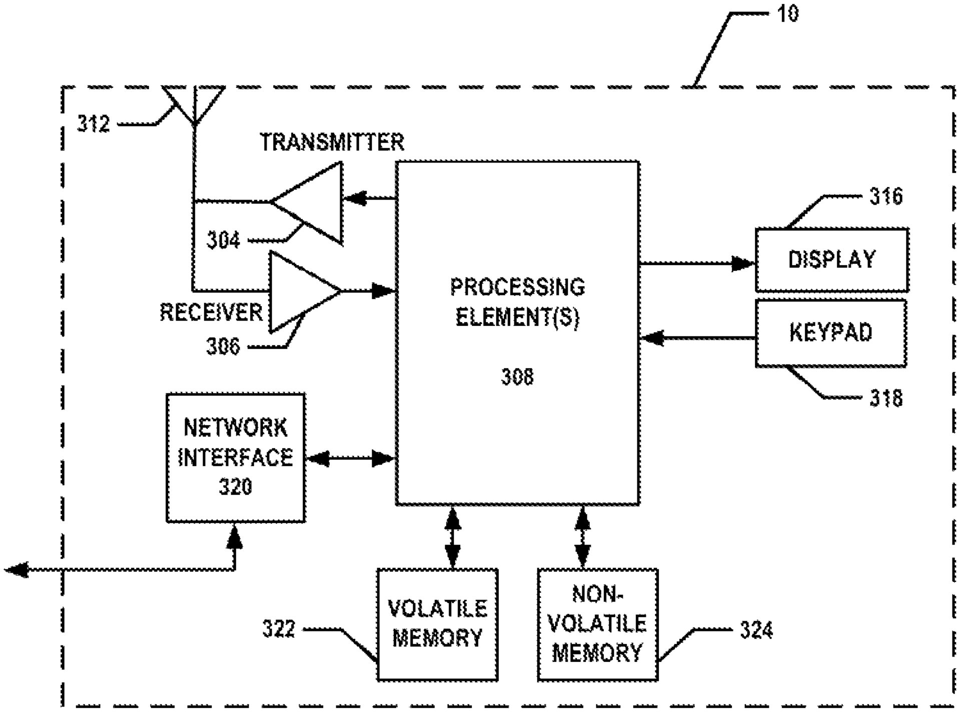

FIG. 3 is a schematic diagram of an example computing entity of a quantum computer system that may be used in accordance with an example embodiment.

Figure 4:
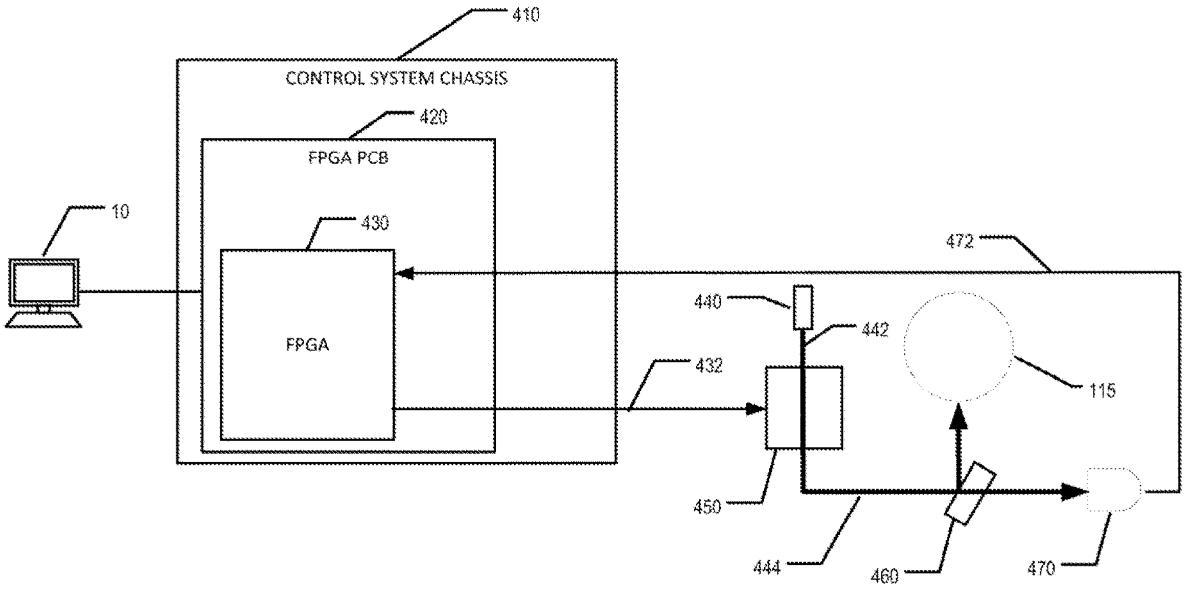

FIG. 4 is a schematic diagram of an example closed loop control system that may be used in accordance with an example embodiment.

Figure 5:
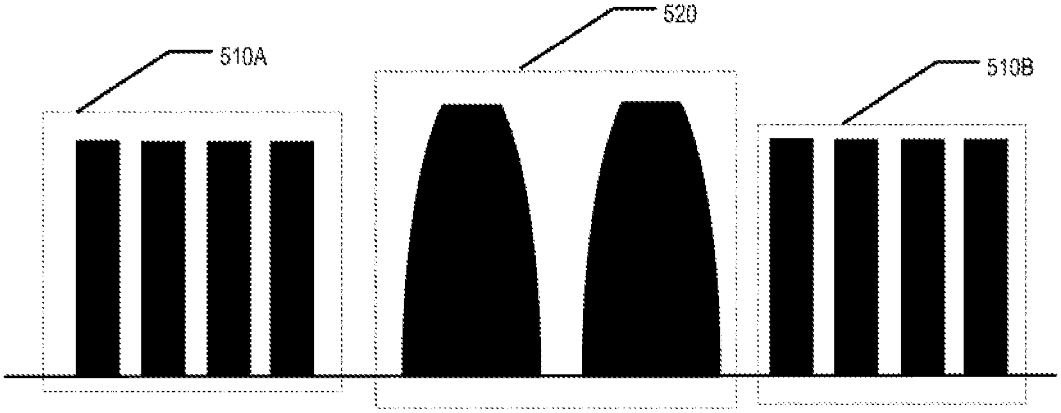

FIG. 5 is an example of an intensity profile in accordance with at least some example embodiments of the present disclosure.

Figure 6:
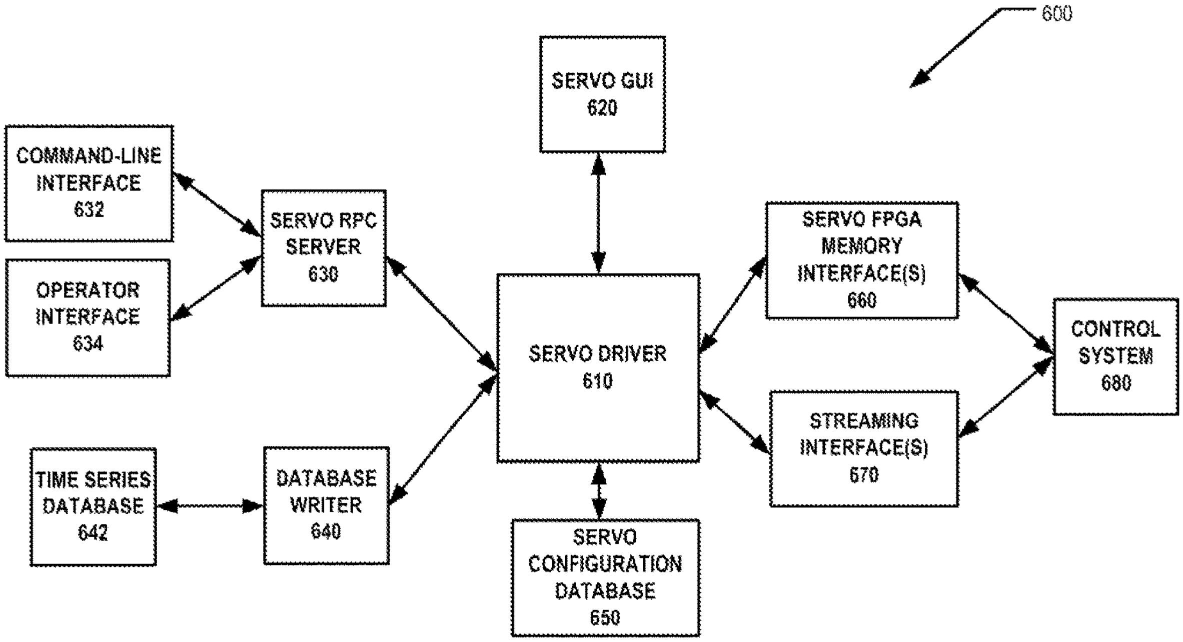

FIG. 6 is a schematic diagram of an example of a servo control system associated with the integrated servo system in accordance with at least some example embodiments of the present disclosure.

Figure 7:
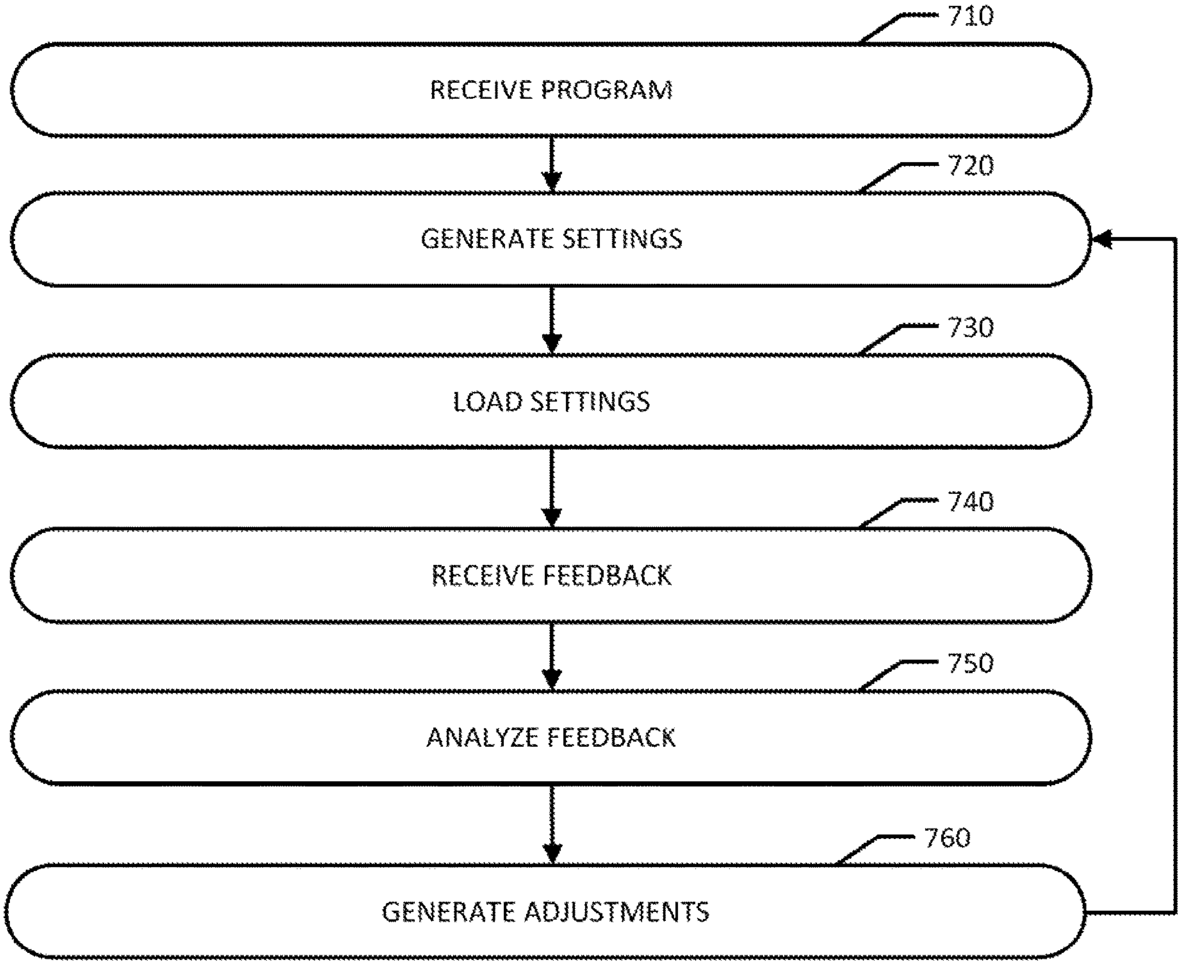

FIG. 7 illustrates an example process for calibrating a closed loop control system in accordance with at least some example embodiments of the present disclosure.

DETAILED DESCRIPTION

Embodiments of the present disclosure now will be described more fully with reference to the accompanying drawings, in which some, but not all, embodiments of the disclosure are illustrated. Indeed, embodiments of the disclosure may be embodied in many different forms and should not be construed as limited to the embodiments set forth herein; rather, these embodiments are provided so that this disclosure will satisfy applicable legal requirements. The term "or" (also denoted "/") is used herein in both the alternative and conjunctive sense, unless otherwise indicated. The terms "illustrative" and "exemplary" are used to be examples with no indication of quality level. The terms "generally," "substantially," and "approximately" refer to within engineering and/or manufacturing tolerances and/or within user measurement capabilities, unless otherwise indicated. Like reference numbers in the drawings refer to like elements throughout.

Many modifications and other embodiments of the disclosure set forth herein will come to mind to one skilled in the art to which this disclosure pertains having the benefit of the teachings presented in the foregoing description and the associated drawings. Therefore, it is to be understood that the embodiments are not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims.

Overview

Quantum computer systems, such as QCCD trapped-ion quantum computers, manipulate qubits for use in various computing actions. The term "QCCD" refers to a quantum charge-coupled device architecture that enables qubit storage and positioning via a number of operations. Qubits in a QCCD move to specific location(s) on a chip to perform quantum operations (e.g., via gating). An example QCCD architecture uses atomic objects confined within an atomic object confinement apparatus, such as ions trapped within an ion trap, as qubits.

Quantum computers may utilize qubits as inputs to logic gates configured for performing logical operations based on the states of the input qubits. Configurations of logic gates may be combined in a myriad of ways in a quantum program, for example where the quantum program is specifically configured for reaching a desired result. The terms "quantum program" and "quantum circuit" refer to any number of gate operations to be performed utilizing one or more qubits in a quantum computer system. A quantum program may include any number of gating operations performed on one or more qubits of the quantum computing environment. Each "gate," "logic gate," "gate operation," "gating operation," or "operation" of a quantum program involves a single qubit or a qubit group of more than one qubit. Quantum operations are controlled by subsystems and components of the quantum computer, including servo systems.

Quantum computer systems perform quantum computation by executing quantum programs written by users or operators. These programs are often described in a high level language that describes how to manipulate qubits. High level programs are broken down into many low level operations for diverse devices (instruments, electronics, optics, and mechanical devices) that manipulate qubits to perform the desired quantum computation. These manipulations must be very precise and coordinated with one another. The system that orchestrates these operations may be a "controller," which may include or control a plurality of servo systems.

Quantum computer systems may be limited by their use of discrete servo systems due to noise introduced by discrete servo systems as well as their slower responsiveness. In various embodiments herein, servo systems have been integrated (e.g., integrated servo system(s)) into a controller of a quantum computer. In various embodiments, the controller includes with a plurality of tightly integrated servo systems that are highly customizable to optimize execution of quantum operations for quantum computations.

In various embodiments, integrated servo systems may share one or more components (e.g., filters, amplifiers, mixers, splitters, baluns, local oscillators, etc.). In various embodiments, integrated servo systems may work in conjunction with one or more discrete servo systems.

Additionally or alternatively, through the improvements described herein, some embodiments of the present disclosure may allow a quantum computer system to solve larger and/or more complicated problems by virtue of the aforementioned ability to execute quantum programs with, among other things, less noise and with greater responsive and control over quantum operations executed by the quantum computer system.

Example Systems and Apparatuses

FIG. 1 provides a schematic diagram of an example quantum computing environment comprising quantum computing system 100 where a quantum processor 115 comprises an atomic object confinement apparatus 120 (e.g., an ion trap and/or the like) having a plurality of atomic objects (e.g., atoms, ions, and/or the like) confined therein, in accordance with an example embodiment.

In various embodiments, the quantum computing system 100 comprises a computing entity 10 and a quantum computer 110. In various embodiments, the quantum computer 110 comprises a quantum system controller 30, which may be referred to as controller 30, and a quantum processor 115. In various embodiments, the controller 30 is configured, programmed, and/or the like to control the quantum processor 115. In an example embodiment, the quantum processor 115 comprises a plurality of qubits (e.g., data qubits that may be organized into logical qubits, ancilla qubits, and/or the like). In various embodiments, the quantum computer 110 includes or communicates with databases (not shown) described herein. For example, the databases may be stored by one or more computing entities 10 that are in communication with the controller 30 via one or more wired and/or wireless networks 20 and/or stored by memory local to the controller 30.

In various embodiments, the quantum processor 115 comprises means for controlling the evolution of quantum states of the qubits. For example, in an example embodiment, the quantum processor 115 comprises a cryostat and/or vacuum chamber 40 enclosing a confinement apparatus 120 (e.g., an ion trap), one or more manipulation sources 60, one or more voltage sources 50, and/or one or more optics collection systems 70. For example, the cryostat and/or vacuum chamber 40 may be a temperature and/or pressure-controlled chamber. In an example embodiment, the manipulation signals generated by the manipulation sources 60 are provided to the interior of the cryostat and/or vacuum chamber 40 (where the atomic object confinement apparatus 120 is located) via corresponding optical paths 66 (e.g., 66A, 66B, 66C). In an example embodiment, the one or more manipulation sources 60 may comprise one or more lasers (e.g., optical lasers, microwave sources, and/or the like). In various embodiments, the one or more manipulation sources 60 are configured to manipulate and/or cause a controlled quantum state evolution of one or more atomic objects within the confinement apparatus. In various embodiments, the generation of the manipulation signals by the manipulation sources 60 is controlled, at least in part by one or more integrated servo systems 217. In various embodiments, the atomic objects within the atomic confinement apparatus (e.g., ions trapped within an ion trap) act as the data qubits and/or ancilla qubits of the quantum processor 115 of the quantum computer 110. For example, in an example embodiment, wherein the one or more manipulation sources 60 comprise one or more lasers, the lasers may provide one or more laser beams to atomic objects trapped within the confinement apparatus 120 within the cryostat and/or vacuum chamber 40. For example, the manipulation sources 60 may generate and/or provide laser beams configured to ionize atomic objects, initialize atomic objects within the defined two state qubit space of the quantum processor, perform gates one or more qubits of the quantum processor, read a quantum state of one or more qubits of the quantum processor, and/or the like.

In various embodiments, the quantum computer 110 comprises an optics collection system 70 configured to collect and/or detect photons generated by qubits (e.g., during reading procedures, such as measurement operations). The optics collection system 70 may comprise one or more optical elements (e.g., lenses, mirrors, waveguides, fiber optics cables, and/or the like) and one or more photodetectors. In various embodiments, the photodetectors may be photodiodes, photomultipliers, charge-coupled device (CCD) sensors, complementary metal oxide semiconductor (CMOS) sensors, Micro-Electro-Mechanical Systems (MEMS) sensors, and/or other photodetectors that are sensitive to light at an expected fluorescence wavelength of the qubits of the quantum computer 110. In various embodiments, the detectors may be in electronic communication with the quantum system controller 30 via one or more A/D converters 225 (see FIG. 2) and/or the like.

In various embodiments, the quantum computer 110 comprises one or more voltage sources 50. For example, the voltage sources 50 may comprise a plurality of voltage drivers and/or voltage sources and/or at least one RF driver and/or voltage source. The voltage sources 50 may be electrically coupled to the corresponding potential generating elements (e.g., electrodes) of the confinement apparatus 120, in an example embodiment. Varying the electrical potential(s) may move the ions between locations or states. In various embodiments, how to vary the electrical potential(s) may be defined by waveforms that specify one or more voltages to apply over a period of time. In various embodiments, the one or more voltage source 50 may be coupled to electrodes via circuitry. In various embodiments, the circuitry coupling the voltage sources 50 the electrodes may be located outside the cryostat and/or vacuum chamber 40, inside the cryostat and/or vacuum chamber 40, or both inside and outside the cryostat and/or vacuum chamber 40. In various embodiments, the circuitry coupling the voltage sources 50 to the electrodes will be comprised of circuit components capable of and/or configured to operate at the temperatures for their location, such as those in the cryostat and/or vacuum chamber, which may have temperatures below 4 Kelvin.

In some embodiments the computing entity 10 embodies one or more computing devices embodied in hardware, software, firmware, and/or any combination thereof. The computing entity 10 may be embodied by a user device configured to provide various functionality. In this regard, the computing entity 10 may embody a conventional computing environment that interacts with the quantum computer 110. Non-limiting examples of a computing entity 10 include a specially configured mobile device, tablet, smartphone, personal computer, laptop, enterprise terminal, and/or the like. In some embodiments, the computing entity 10 is configured entirely by specially configured software application(s) installed to and/or otherwise executable via the computing entity 10 to provide various functionality for accessing and/or otherwise controlling the quantum computer 110 as described herein. In various embodiments, the computing entity 10 is a conventional and/or classical computer.

In some embodiments, the computing entity 10 includes specially configured hardware, software, firmware, and/or a combination thereof, that enables access to and/or configuration of the quantum computer 110. In some embodiments, the computing entity 10 provides access to functionality for generating and/or retrieving a quantum program for execution via the controller 30 of the quantum computer 110. In this regard, the computing entity 10 may receive one or more user input(s) for constructing and/or that otherwise embody a quantum program to be executed. For example, a user of the computing entity 10 may interact with the computing entity 10 to construct a quantum program, store the quantum program, and submit the quantum program for execution via the controller of the quantum computer 110. In some embodiments, the computing entity 10 is embodied by a user-facing device of the quantum computer 110, for example such that communications can occur without requiring the network 20.

Additionally or alternatively, in some embodiments, the computing entity 10 enables user input and/or output for accessing the quantum computer 110 to execute a quantum program. In some embodiments, the computing entity 10 communicates with one or more computing devices of the quantum computer 110, such as a controller 30, which may generate and/or compile instructions for executing via a quantum computer 110.

Additionally or alternatively, a computing entity 10 is configured to allow a user to provide input to the quantum computer 110 (e.g., via a user interface of the computing entity 10) and receive, view, and/or the like output from the quantum computer 110.

In an example embodiment, the computing entity 10 may translate, configure, format, and/or the like information/data, quantum computing algorithms, quantum program, and/or the like into a computing language, executable instructions, command sets, and/or the like that the quantum system controller 30 can understand and/or implement. In various embodiments, one or more device(s) of the quantum computer 110 (e.g., controller 30) receive data from the computing device entity 10 that embodies the quantum program, instructions to be performed to manipulate the quantum computer, and/or the like. In various embodiments the computing entity 10 may optimize a quantum program to generate an optimized quantum program, such as those described herein.

Additionally or alternatively, in various embodiments, the controller 30 may receive the quantum program from the computing entity 10 and compile it to produce control system instructions embodying hardware manipulation instructions or machine code level commends configured to, when executed, cause the execution of the quantum program on a quantum computer. In various embodiments, the execution of a quantum program may include providing and/or controlling voltages to one or more electrodes. In various embodiments, the controller 30 may optimize a quantum program to generate an optimized quantum program, such as with dynamic components described herein.

In various embodiments, the controller 30 is embodied by one or more computing devices external from but communicable with the quantum computer 110. For example, the controller 30 may be embodied by a circuit compiler embodied in a dedicated computing system embodied in hardware, software, firmware, and/or a combination thereof internal or external to the quantum computer 110, dedicated hardware communicable with a quantum computer 110, software executing on a computing system communicable with the quantum computer 110, and/or the like.

In various embodiments, the controller 30 may embody a conventional computing system, for example specially configured via one or more specialized software application(s) to execute one or more process(es) that determine positions for the qubits at various time steps and/or instructions for repositioning the qubits to such position. For example, the controller 30 may determine position assignments for each qubit at various time steps, and/or instructions embodying gate and/or swap operations, which may cause the qubits to reach specific positions at each of the appropriate time steps.

In various embodiments, the quantum system controller 30 is configured to control the voltage sources 50, cryostat system and/or vacuum system controlling the temperature and pressure within the cryostat and/or vacuum chamber 40, manipulation sources 60, and/or other systems controlling various environmental conditions (e.g., temperature, pressure, and/or the like) within the cryostat and/or vacuum chamber 40 and/or configured to manipulate and/or cause a controlled evolution of quantum states of one or more atomic objects within the confinement apparatus. For example, the quantum system controller 30 may cause a controlled evolution of quantum states of one or more atomic objects within the confinement apparatus to execute a quantum program, such as with integrated servo systems. For example, the quantum system controller 30 may cause a reading procedure (e.g., measurement operation) comprising coherent shelving to be performed, possibly as part of executing a quantum program. Additionally, the quantum system controller 30 is configured to communicate and/or receive input data from the optics collection system 70 and corresponding to the reading of the quantum state of qubits of the quantum computer 110. In various embodiments, the atomic objects confined within the confinement apparatus are used as qubits of the quantum computer 110.

In various embodiments, the quantum system controller 30 is further configured to control a cryostat system and/or vacuum system controlling the temperature and pressure within the cryostat and/or vacuum chamber 40, cooling system, and/or other systems controlling the environmental conditions (e.g., temperature, humidity, pressure, and/or the like) within the cryostat and/or vacuum chamber 40.

FIG. 2 provides a schematic diagram of an example quantum system controller 30, which may comprise various quantum system controller elements including processing element(s) 205, memory 210, driver controller elements 215, a communication interface 220, analog-digital (A/D) converter elements 225, and/or the like. In various embodiments, the quantum system controller 30 is configured to receive input data, including input data generated by the optics collection system via the A/D converter(s) 225. In various embodiments, the processing element(s) 205 are configured to operate as described herein.

In various embodiments, the processing element(s) 205 comprise processing elements such as programmable logic devices (CPLDs), microprocessors, coprocessing entities, application-specific instruction-set processors (ASIPs), integrated circuits, application specific integrated circuits (ASICs), field programmable gate arrays (FPGAs), programmable logic arrays (PLAs), hardware accelerators, other processing elements and/or circuitry, and/or the like. The term circuitry may refer to an entirely hardware embodiment or a combination of hardware and computer program products. In an example embodiment, a processing element 205 of the quantum system controller 30 comprises a clock and/or is in communication with a clock.

In various embodiments, the memory 210 comprises non-transitory memory such as volatile and/or non-volatile memory storage such as one or more of hard disks, ROM, PROM, EPROM, EEPROM, flash memory, MMCs, SD memory cards, Memory Sticks, CBRAM, PRAM, FeRAM, RRAM, SONOS, racetrack memory, RAM, DRAM, SRAM, FPM DRAM, EDO DRAM, SDRAM, DDR SDRAM, DDR2 SDRAM, DDR3 SDRAM, RDRAM, RIMM, DIMM, SIMM, VRAM, cache memory, register memory, and/or the like.

In various embodiments, the memory 210 may store a queue of commands to be executed to cause a quantum program to be executed (e.g., an executable queue), qubit records corresponding the qubits of quantum computer (e.g., in a qubit record data store, qubit record database, qubit record table, and/or the like), a calibration table, computer program code (e.g., in a one or more computer languages, specialized quantum system controller language(s), and/or the like), and/or the like. In an example embodiment, execution of at least a portion of the computer program code stored in the memory 210 (e.g., by a processing element 205) causes the quantum system controller 30 to perform one or more steps, operations, processes, procedures and/or the like for generating one or more sets of commands configured to cause the quantum processor 115 to perform at least a portion of a quantum program; to update one or more qubit registries; and/or the like. In an example embodiment, execution of at least a portion of the computer program code stored in the memory 210 causes the quantum system controller 30 to cause one or more commands to be performed.

In various embodiments, the driver quantum system controller elements 215 include one or more drivers and/or quantum system controller elements each configured to control one or more drivers. In various embodiments, the driver quantum system controller elements 215 may comprise drivers and/or driver controllers. For example, the driver controllers may be configured to cause one or more corresponding drivers to be operated in accordance with executable instructions, commands, and/or the like generated, scheduled, and executed by the quantum system controller 30. For example, the processing element 205 may generate one or more commands to be performed by a first driver.

In various embodiments, the driver controller elements 215 enable the quantum system controller 30 to operate a voltage sources 50, manipulation sources 60, cooling system, vacuum systems, and/or the like. In various embodiments, the drivers may be drivers for controlling the flow of current and/or voltage applied to electrodes (e.g., configured to operate and/or control one or more voltage sources 50) used for maintaining and/or controlling the trapping potential of the confinement apparatus 120 (and/or other drivers for providing driver action sequences to potential generating elements of the confinement apparatus); laser drivers (e.g., configured to operate and/or control one or more manipulation sources 60); vacuum component drivers; cryostat and/or vacuum system component drivers; cooling system drivers, and/or the like.

In various embodiments, each of driver controller elements 215 correspond to an endpoint within the system (e.g., a component of a manipulation source 60, a component of a voltage source 50 (radio frequency voltage sources, arbitrary waveform generators (AWG), direct digital synthesizer (DDS), and/or other waveform generator), a component of a cooling and/or vacuum system, a component of the optics collection system 70, and/or the like). Each endpoint within the quantum computer 110 represents an individual hardware control. Each endpoint may have its own set of accepted micro-commands, in various embodiments. Examples include but are not limited to a voltage source 50 such as a direct digital synthesizer (DDS), component of an optics collection system 70 such as a photomultiplier tube (PMT), a component of a manipulation source 60 such as a laser driver and/or optical modulator switch, and/or general-purpose output (GPO). Individual commands for a DDS allow for setting power level, frequency and phase of a controlling signal generated thereby. Commands for a PMT interface include start/stop photon count and reset of count, in various embodiments. Commands for a GPO endpoint include setting and/or clearing one or more output lines. These output lines can be used to control external hardware in a manner synchronized with the execution of a quantum program.

In various embodiments, the driver controller elements 215 include one or more integrated servo systems 217. The integrated servo systems 217 may be used for many applications, including control of temperature (e.g., integrated temperature servo system), mechanical (e.g., integrated mechanical servo system), electrode (e.g., integrated electrode servo system), arbitrary wave generation with feedback (e.g., integrated AWG servo system), calibration (e.g., integrated calibration servo system), etc.

An integrated servo system 217 may include an input arm that receives one or more input signals. In various embodiments an input signal may be from a local oscillator, DDS, AWG, AOM, sensor (e.g., photodetector), etc.

An integrated servo system 217 may also include an output arm that outputs one or more signals. In various embodiments, the output signal may be input into a modulator, which may generate a modulated signal (e.g., modulated laser beam) based on received output signal of the integrated servo system 217.

In various embodiments, the integrated servo system 217 comprises a plurality of filters, amplifiers, mixers, splitters, local oscillators, etc. Filters may be used to isolate particular frequencies or phases in signals propagating through the integrated servo system 217. In various embodiments, filters may filter undesired components of a signal (e.g., generated through an amplification, mixing, nonlinear function, and/or the like) to be removed from the signal to prevent further processing of the undesired components of the signal by the integrated servo system 217.

In various embodiments, signals and/or the like may be propagated between various components of the integrated servo system 217, such as with fiber optics and/or waveguides. Additionally or alternatively, various embodiments may include two or more of the integrated servo systems 217 be physically mounted together such that the input arm and/or the output arm of each integrated servo system may share components.

In various embodiments, an integrated servo system 217 is configured to provide frequency, phase, and/or timing control for a laser beam. For example, the integrated servo system 217 may be configured to lock or to dynamically adjust an amplitude, phase, or frequency such that noise associated with the laser beam is controlled and/or minimized. In another example, the integrated servo system 217 may be configured to change the amplitude, phase, and/or frequency to a desired intensity profile, which may change over time (e.g., with different pulses). In various embodiments, such changes may be based on inputs from a sensor (e.g., photodetector) or may be based on inputs associated with the execution of a quantum program (e.g., calibration program).

In various embodiments, the quantum system controller 30 comprises means for communicating and/or receiving signals from one or more optical receiver components (e.g., of the optics collection system 70). For example, the quantum system controller 30 may comprise one or more analog-digital (A/D) converter elements 225 configured to receive signals from one or more optical receiver components (e.g., a photodetector of the optics collection system 70), calibration sensors, and/or the like. In various embodiments, the A/D converter elements 225 are configured to write the input data generated by converting the received signals generated by one or more optical receiver components of the optics collection system 70 to memory 210.

In various embodiments, the quantum system controller 30 may comprise a communication interface 220 for interfacing and/or communicating with, for example, a computing entity 10. For example, the quantum system controller 30 may comprise a communication interface 220 for receiving executable instructions, command sets, and/or the like from the computing entity 10 and providing output received from the quantum computer 110 (e.g., from an optics collection system 70) and/or the result of a processing the output to the computing entity 10. In various embodiments, the computing entity 10 and the quantum system controller 30 may communicate via a direct wired and/or wireless connection and/or via one or more wired and/or wireless networks 20.

FIG. 3 provides an illustrative schematic representative of an example computing entity 10 that can be used in conjunction with embodiments of the present disclosure. In various embodiments, a computing entity 10 is a classical (e.g., semiconductor-based) computer configured to allow a user to provide input to the quantum computer 110 (e.g., via a user interface of the computing entity 10) and receive, display, analyze, and/or the like output from the quantum computer 110. In various embodiments, a user may use computing entity 10 to provide input to the quantum computer 110, such as when a user may provide input that results in a quantum program being created and/or executed.

As shown in FIG. 3, a computing entity 10 can include an antenna 312, a transmitter 304 (e.g., radio), a receiver 306 (e.g., radio), and a processing element 308 that provides signals to and receives signals from the transmitter 304 and receiver 306, respectively. The signals provided to and received from the transmitter 304 and the receiver 306, respectively, may include signaling information/data in accordance with an air interface standard of applicable wireless systems to communicate with various entities, such as a quantum system controller 30, other computing entities 10, and/or the like. The computing entity 10 can include a network interface 320, which may provide signals to and receive signals in accordance with an interface standard of applicable network systems to communicate with various entities, such as a quantum system controller 30, other computing entities 10, and/or the like.

In this regard, the computing entity 10 may be capable of operating with one or more air interface standards, communication protocols, modulation types, and access types. For example, the computing entity 10 may be configured to receive and/or provide communications using a wired data transmission protocol, such as fiber distributed data interface (FDDI), digital subscriber line (DSL), Ethernet, asynchronous transfer mode (ATM), frame relay, data over cable service interface specification (DOCSIS), or any other wired transmission protocol. Similarly, the computing entity 10 may be configured to communicate via wireless external communication networks using any of a variety of protocols, such as general packet radio service (GPRS), Universal Mobile Telecommunications System (UMTS), Code Division Multiple Access 2000 (CDMA2000), CDMA2000 1× (1×RTT), Wideband Code Division Multiple Access (WCDMA), Global System for Mobile Communications (GSM), Enhanced Data rates for GSM Evolution (EDGE), Time Division-Synchronous Code Division Multiple Access (TD-SCDMA), Long Term Evolution (LTE), Evolved Universal Terrestrial Radio Access Network (E-UTRAN), Evolution-Data Optimized (EVDO), High Speed Packet Access (HSPA), High-Speed Downlink Packet Access (HSDPA), IEEE 802.11 (Wi-Fi), Wi-Fi Direct, 802.16 (WiMAX), ultra wideband (UWB), infrared (IR) protocols, near field communication (NFC) protocols, Wibree, Bluetooth protocols, wireless universal serial bus (USB) protocols, and/or any other wireless protocol. The computing entity 10 may use such protocols and standards to communicate using Border Gateway Protocol (BGP), Dynamic Host Configuration Protocol (DHCP), Domain Name System (DNS), File Transfer Protocol (FTP), Hypertext Transfer Protocol (HTTP), HTTP over TLS/SSL/Secure, Internet Message Access Protocol (IMAP), Network Time Protocol (NTP), Simple Mail Transfer Protocol (SMTP), Telnet, Transport Layer Security (TLS), Secure Sockets Layer (SSL), Internet Protocol (IP), Transmission Control Protocol (TCP), User Datagram Protocol (UDP), Datagram Congestion Control Protocol (DCCP), Stream Control Transmission Protocol (SCTP), HyperText Markup Language (HTML), and/or the like.

Via such communication standards and protocols, the computing entity 10 may communicate with various other entities using concepts such as Unstructured Supplementary Service information/data (USSD), Short Message Service (SMS), Multimedia Messaging Service (MMS), Dual-Tone Multi-Frequency Signaling (DTMF), and/or Subscriber Identity Module Dialer (SIM dialer). The computing entity 10 may also download changes, add-ons, and updates, for instance, to its firmware, software (e.g., including executable instructions, applications, program modules), and operating system.

The computing entity 10 may also comprise a user interface device comprising one or more user input/output interfaces (e.g., a display 316 and/or speaker/speaker driver coupled to a processing element 308 and a touch screen, keyboard, mouse, and/or microphone coupled to a processing element 308). For instance, the user output interface may be configured to provide an application, browser, user interface, interface, dashboard, screen, webpage, page, and/or similar words used herein interchangeably executing on and/or accessible via the computing entity 10 to cause display or audible presentation of information/data and for interaction therewith via one or more user input interfaces. The user input interface can comprise any of a number of devices allowing the computing entity 10 to receive data, such as a keypad 318 (hard or soft), a touch display, voice/speech or motion interfaces, scanners, readers, or other input device. In embodiments including a keypad 318, the keypad 318 can include (or cause display of) the conventional numeric (0-9) and related keys (#, *), and other keys used for operating the computing entity 10 and may include a full set of alphabetic keys or set of keys that may be activated to provide a full set of alphanumeric keys. In addition to providing input, the user input interface can be used, for example, to activate or deactivate certain functions, such as screen savers and/or sleep modes. Through such inputs the computing entity 10 can collect information/data, user interaction/input, and/or the like.

The computing entity 10 can also include volatile storage or memory 322 and/or non-volatile storage or memory 324, which can be embedded and/or may be removable. For instance, the non-volatile memory may be ROM, PROM, EPROM, EEPROM, flash memory, MMCs, SD memory cards, Memory Sticks, CBRAM, PRAM, FeRAM, RRAM, SONOS, racetrack memory, and/or the like. The volatile memory may be RAM, DRAM, SRAM, FPM DRAM, EDO DRAM, SDRAM, DDR SDRAM, DDR2 SDRAM, DDR3 SDRAM, RDRAM, RIMM, DIMM, SIMM, VRAM, cache memory, register memory, and/or the like. The volatile and non-volatile storage or memory can store databases, database instances, database management system entities, data, applications, programs, program modules, scripts, source code, object code, byte code, compiled code, interpreted code, machine code, executable instructions, and/or the like to implement the functions of the computing entity 10.

In various embodiments, a closed loop control system may include one or more sensors to measure one or more parameters, settings, subsystems, etc. of a quantum computing system 100. A sensor may, for example, output a control signal (e.g., a voltage or a current) indicative of a parameter sensed. In various embodiments, the sensor may be a photodetector that may provide an output control signal of an output voltage indicative of the light or electromagnetic radiation sensed by the photodetector. In various embodiments, the control signal from the sensor may be provided as an input into one or more integrated servo systems 217, which may be used to adjust the output of an integrated servo system 217, which may be a control signal into another component of the closed loop control system.

FIG. 4 provides a schematic diagram of an example closed loop control system that may be used in accordance with an example embodiment. A closed loop control system may be comprised of one or more components of other systems or subsystems of the quantum computing system 100. In various embodiments, an integrated servo system 217 may be used to control laser beam intensity for a trapped ion quantum computing system 100 in order to provide a specific laser beam intensity profile required to allow for execution of quantum operations. To cause the evolution of quantum states of the qubits in accordance with a quantum program may require specific intensity profiles with specific pulses having specific shapes at specific times. Trapped-ion quantum computers may use a laser, such as from a manipulation source 60, to manipulate a qubit and control a motional state of a qubit. Many challenges occur with such lasers that discrete servo systems fail to meet, including reducing noise as well as providing precise and dynamically controlled intensity profiles to manipulate and control a qubit during one or more quantum operations of a quantum program.

In various embodiments, a controller 30 may coordinate adjusting a laser intensity profile using sensors, including electro-optical devices (e.g., a photodetector) in a closed loop control system. In various examples, execution of a quantum program may introduce variations in noise (e.g., electrical noise, thermal noise, mechanical noise, etc.) that create variations in the laser's intensity. The sensor's output voltage will change as electrical, thermal, and mechanical noise sources effect the system. In various embodiments, noise in the laser's intensity may cause operational errors during the execution of the quantum program.

In various embodiment, a computing entity 10 may provide the controller 30 with a quantum program. The controller 30 may include a control system chassis 410. The control system chassis 410 may include one or more FPGA Printed Circuit Boards (PCBs) 420 and each FPGA PCB may include one or more FPGAs 430. While FIG. 4 depicts one control system chassis 410, one FPGA 420, and one FPGA 430, it will be appreciated that various embodiments may include more than one of each.

In various embodiments of FIG. 4, an integrated servo system 217 may be comprised of an FPGA 430 as well as additional components, such as those described herein, including one or more servo channels, ADCs, DACs, FPGA memories, FPGA memory interfaces, etc. The FPGA PCB 420 may include one or more channels, such as servo channels. A servo channel may include one or more channel components to adjust, filter, and/or modify a signal. A servo channel may include one or more inputs and/or outputs to transmit a control signal between one or more components of a closed loop control system. In the closed loop control system of FIG. 4, there are components of a laser source 440, acoustic-optical modulator (AOM) 450, optical element 460 (e.g., mirrors, lens, splitters, etc.), and sensor 470 (e.g., photodetector). Also depicted in FIG. 4 are FPGA output signal (e.g., a control signal) 432, laser output 442, modulated laser output 444, and sensor output signal (e.g., a control signal) 472. In various embodiments, the control signals (e.g., FGPA output signal 432 and sensor output 472) may be modified by one or more electrical components (e.g., filters, amplifiers, mixers, splitters, balun, etc.), and the one or more electrical components may be located on the FPGA 430, the FPGA PCB 420 (e.g. in servo channel), or be a discrete component located off the FPGA PCB 420.

The FPGA output signal 432 may be an analog or a digital signal. The FPGA output signal 432 is input in the AOM 450 to modulate laser output 442. After the laser output 442 (e.g., laser beam) is modulated at AOM 450, modulated laser output 444 is input into optical element 460. In various embodiments, optical element 460 may diffract a small portion of the modulated laser output 444 into a sensor 470 while directing the remainder to a quantum processor 115. Sensor 470 may be a photodetector that, on receipt of the diffracted amount of modulated laser output 444, generates a sensor output signal 470 of a voltage. The sensor output signal 470 may be input into the FPGA 430. In various embodiments, this creates a closed loop control system where a control signal 432 is output by the FPGA 430 and a control signal 472 is received back by the FPGA 430, with the FGPA 430 configured to modify the control signal 432 based on the control signal 472. In various embodiments, a daughter card PCB (not depicted) may be located in control system chassis 410, which may include being mounted to FPGA PCB 420 either directly or indirectly. A daughter card may be associated with a specific integrated servo system 217 or may be associated with more than one integrated servo system 217. A daughter card may include one or more components, similar to FPGA PCB 420.

In various embodiments, the closed loop control system of FIG. 4 is provided for an integrated servo system 217 with FPGA 430 to monitor and adjust the intensity of laser output 442 of laser 440 by AOM 450 to create a desired intensity profile. For example, the integrated servo system 217 will dynamically modulate the laser output 442 with the AOM 450 to remove fluctuations (e.g., fluctuations due to noise) in the modulated laser 444 that are observed the by the sensor 470.

In various embodiments, the control signal 432 may be generated with DDS. Additionally, the generation of control signal 432 may be in accord with other hardware and applications associated with controller 30 in order to modulate laser output 442 in accordance with a quantum program.

In various embodiments, a plurality of integrated servo systems 217 may be used to control and modify the output of a plurality of lasers. In various embodiments, the plurality of lasers may be greater than the plurality of integrated servo systems 217. Alternatively, the plurality of integrated servo systems 217 may be greater than the plurality of lasers. In various embodiments, a control signal output 432 may be input into a plurality of AOM 450, where each AOM 450 may by associated with a different laser output 442.

In various embodiments, a control system chassis 410 may include a plurality of FPGA PCBs 420. The FPGA PCBs may be connected via servo channels, I/O connectors, board-to-board connectors, edge connects, backplane connectors, etc.

In various embodiments, there may be a plurality of independent control systems (e.g., N control systems). Each control system may include: one or more laser sources 440 to generate a respective one or more laser output 442 (e.g., a laser beam); one or more AOM 450 that may receive a respective one or more control signals 432, which may each be generated by a one or more FPGA 430, used to module the respective laser output 442; one or more optical element 460; and one or more sensors 470. Each of the independent control systems may be associated with a respective integrated servo system 217 that may be used to control and modify the output of the laser source 440 as described herein. In various embodiments each independent control system may be associated with its own FPGA PCB 420 and FPGA 430. Alternatively and/or additionally, two or more of the independent control systems may shared an FPGA PCB 420 and or FPGA 430. For example, and FPGA 430 may include only one integrated servo system 217 or may contain more than one integrated servo system 217. In various embodiments, each of the independent control systems may operate independently. Additionally or alternatively, each of the independent control systems (e.g., a first independent control system) may operate in conjunction and/or simultaneously with one or more other independent control systems (e.g., a second independent control system) of the plurality of independent control systems. In various embodiments each of the independent control systems (e.g., a first independent control system) may utilize only separate components from other independent control systems (e.g., a second independent control system), such as with each independent control system being utilized in parallel. Alternatively and/or additionally, one or more of the independent control systems (e.g., a third independent control system) may utilize one or more components of another independent control system (e.g., a fourth independent control system).

In various embodiments, FPGA 430 may comprise one or more DDS, one or more analog-to-digital convertors (ADC), digital-to-analog converters (DAC), Balun, VGA, AM, amplifiers, mixers, splitters, and other components. In various embodiments, FPGA 430, as a part of the integrated servo system 217, may be configured to determine adjustments for controlling or modulating, for example, a laser beam. In various embodiments, FPGA 430 may include a processor to convert high level descriptions of a comment from a user (e.g., at computing entity 10) into a low level code that may be executed by hardware. Additionally or alternatively, FPGA 430 may include a compiler that compiles code and/or programs from a user into machine executable instructions. Additionally and/or alternatively, FPGA 430 may be configured with an analysis engine and/or a real-time engine.

In various embodiments, an analysis engine may include circuitry configured to monitor one or more sensors, such as those with a closed loop control system, analyze one or more control signals (e.g., 472), such as to quantify and classify noise, which may be indicated by variations in the control signal 472. In various embodiments, an analysis engine may perform frequency analysis and/or execute signal analysis algorithms, such as algorithms that may indicate frequency content as specific times associated with one or more portions of a quantum program (e.g., portions related to gate pulses and/or quantum operations) and/or algorithms related to analyzing noise during events related to the quantum computing system but not directly related to an integrated servo system 217 (e.g., temperature increase due to failure of a system components (e.g., HVAC unit)). In various examples, a control signal may be analyzed for its frequency content. In various embodiments, the analysis engine may classify noise as passive noise and/or active noise. Passive noise may be noise in a system and/or a component when operations are not being executed, and this may vary with time, temperature, the number of components, etc. Active noise may be noise in a system during execution of operations. The analysis engine may be associated or communicate with one or more memories and/or databases to store historical analysis over time to generate historical trends related to monitoring or analyzing control signals from the one or more sensors. In various embodiments, determinations from historical trends may indicate one or more components needs to be replaced or that an adaptive filter needs to be adjusted or optimized. In various embodiments, the analysis engine may create data objects containing measurements associated with integrated servo system 217 to communicate with, for example, controller 30, and this may include decimating down larger files into smaller files with specific data samples.

The analysis engine may coordinate with the controller 30 to adjust, for example, FPGA output signal 432 to control AOM 450 to execute quantum operations, such as by removing noise in the laser output 442 so that modulated laser output 444 may be provided to quantum processor 115 within tolerances required to execute quantum operations in accord with a quantum program (e.g., amplitude tolerances).

In various embodiments, a real-time engine may include circuitry configured to communicate with the components of the integrated servo system 217, including the analysis engine, to coordinate the execution of portions of a program to associated with the integrated servo system 217 in order to execute quantum operations at the precise timing required by the quantum program. Additionally, the real-time engine may determine and execute adjustments to synchronize hardware to cause execution of quantum operations as required (e.g., adjustments to timing of execution). In various embodiments, real-time engine may monitor and communicate real time metrics as to performance of the integrated servo system 217. In various embodiments, the real-time engine may also provide adjustments to control algorithms to other components of one or more of the integrated servo systems 217. Additionally and/or alternatively, the real-time engine may provide operational insights, including parameters, measurements, and feedback, that may be communicated to controller 30 and/or computing entity 10. In various embodiments, such operational insights may include diagnostic data, which may indicate performance data regarding one or more components, failure data regarding one or more components, etc.

In various embodiments, an integrated servo system 217 may, such as with an analysis engine and/or a real-time engine, incorporate signal processing and/or logic from other components of the quantum computing system 100, including, but are not limited to, components outside of the closed loop control system associated with an integrated servo system 217, any of which may be used to dynamically or programmatically adjust an FPGA output 432 of an integrated servo system 217. In an example, such components may contain environmental controls (e.g., HVAC) that may be associated with cooling the control chassis 410 where an integrated servo system 217 may be located, and the operation (or failure to operate) of the HVAC may positively or negative impact an amount of noise in the components of the integrated servo system 217 and/or an associated closed loop control system.

In various embodiments, calibration of the quantum computer system 100 may include the integrated servo system 217 incorporating signal processing and/or logic from other components to properly calibrate either the integrated servo system 217 or the other component (e.g., a laser, a modulator, a sensor, etc.).

In various embodiments, the analysis engine may be configured to analyze historical trends of a closed control loop, including but not noise associated with the performance of the components associated with the integrated servo system 217 and/or its closed control loop as well as components outside of the closed loop control system. In various embodiments, the analysis engine may incorporate machine learning to analyze noise, including to determine correlations between noise (electrical noise, thermal noise, mechanical noise, active, passive, etc.) and one or more components, operation being executed, etc. Machine learning may be based on test sets, which may include historical data sets containing measurements, adjustments, and settings associated with an integrated servo system 217 and/or other components of the quantum computing system 100. In an example, the analysis engine may analyze the noise on sensor output 472 over time, such as comparing it analogous signals from calibration, from execution of prior quantum programs, from historical trends, and from averages taken over time.

FIG. 5 provides an example of an intensity profile in accordance with at least some example embodiments of the present disclosure.

In various embodiments, the modulated laser output 444 may be controlled by an integrated servo system 217, such as with FPGA output 432. The modulated laser output 444 may be controlled such that the modulated laser output 444 has a specific laser intensity profile in order to execute specific quantum operations when the modulated laser output 444 is provided to the quantum processor 115, such as that depicted in FIG. 5. In various embodiments, execution of specific quantum operations, such as during gating, requires exposing ions to a pulse of laser light with a precisely defined profile, which may include a specific shape, amplitude, and/or duration. An integrated servo system 217 may incorporate feedback (e.g. sensor output 472 from sensor 470) to create a closed loop control system to adjust and/or manipulate pulses and compensate for noise and/or non-linear responses of components. The closed control loop may also be calibrated to remove noise and/or correct for non-linear responses of components, such as the response of AOM 450. In various embodiments, this may be necessary for gate operations that require laser pulses with significantly different intensity levels in short periods of time, such as those of FIG. 5.

FIG. 5 includes square pulse sets 510A, 510B and shaped pulse set 520. The square pulse sets 510A, 510B may include one or more square pulses (FIG. 5 depicts each 510A and 520B with four square pulses). In various embodiments, the square pulse sets 510A, 510B may be examples of wrapper pulse sets when such square pulse sets 510A, 510B are to either side of another pulse set (e.g., shaped pulse set 520). The shaped pulses may include one or more shaped pulses (FIG. 5 depicts two shaped pulses). A shaped pulse may be limited to a maximum amplitude, which may result in the peak of the shaped pulse being flat for a period of time, which may represent a maximum amplitude. By controlling the intensity profile of laser light (e.g., pulses) provided to the quantum processor 115, the fidelity of gates (e.g., single qubit gates, two qubit gates, etc.) may be improved and/or even made possible where operations required by a quantum program require faster response times for specific quantum operations and/or specific ordering of quantum operations.

In various embodiments, an AOM may have a response function that may be non-linear. An integrated servo system 217 may, via calibration, determine the response function of the AOM 450 and, during execution of a quantum program, may provide an FPGA output 432 to the AOM 450 to control the AOM 450 to correct for an undesired portion of the response function in order to output a modulated laser output 444 with a desired intensity profile. In various embodiments, a correction may be to correct for drift and/or noise that would cause an intensity profile to deviate from a required intensity profile necessary to execute quantum operations.

FIG. 6 provides a schematic diagram of an example of a servo control system 600 associated with an integrated servo system 217 in accordance with at least some example embodiments of the present disclosure. In various embodiments, servo control system 600 may be configured to be controlled by controller 30 and/or computing entity 10. In various embodiments, portions of the servo control system 600 are in the integrated servo system 217, the controller 30, and/or the computing entity 10.

Servo control system 600 may be configured to control (e.g., set, adjust, read, measure, etc.) a servo channel or components of a servo channel, which includes a large number of available settings. Available settings may include frequency, phase, gain ratios on the servo input arm(s) and output arm(s), DC voltage offsets, signal delay factors, filter parameters (e.g., type of filter response, gain, gain ratios, cutoff or corner frequency, phase offset, etc.), modulation type (e.g., amplitude modulation, frequency modulation, etc.), control and data processing parameters (e.g., sample rate, decimation, interpolation, averaging, minimums, maximums, standard deviation, statistical analysis, etc.), and various toggle states (e.g. engage servo output hold, bypass individual filter stage(s), disable servo loop, etc.). In various embodiments, a servo channel may be a trace on a PCB with one or more components for signal conditioning (e.g., e.g., filters, amplifiers, mixers, splitters, baluns, local oscillators, ADC, DAC, etc.). In various embodiments, one or more servo channels may be included on a servo PCB, including servo channels with input signal(s) for an integrated servo control system 217 and servo channels for output signal(s) for an integrated servo control system. In various embodiments, a servo channel may be shared by one or more integrated servo systems 217. In various embodiments, each servo channel may correspond to an output control signal associate with a single laser source. In various embodiments, servo channels may use digital signals, analog signals, or both digital and analog signals. In various embodiments, a digital signal from a servo channel may be monitored by controller 30 to determine a status of the integrated servo system 217, the status of a components of the integrated servo system 217, and/or a data value associated with the integrated servo system 217, which may be analyzed and provided to a user (e.g., at computing entity 10).

In various embodiments, the servo control system 600 may include a servo driver 610, a servo GUI 620, a servo Remote Procedure Call (RPC) server 630, a servo command-line interface 632, an operator interface 634, a database writer 640, a time-series database 642, a servo configuration database 650, servo FPGA memory interface(s) 660, streaming interface(s) 670, and a control system 680. In various embodiments, the servo driver 610 may be software hosted on the computing entity 10, the controller 30, and/or the integrated servo system 217. The servo driver 610 may provide high-level methods to write and/or query the values of servo channel-specific settings and/or parameters. The servo driver 610 may map each high-level method to one or more FPGA memory addresses corresponding to one or more servo channel parameter values. The servo driver 610 may convert parameter values and formats (e.g., floating point, integer, string, or Boolean type) to and from values and formats used in the memory registers of FPGA 430 (e.g., binary). In various embodiments, when a high-level write method is called, the servo driver 610 sends a command containing the address(es) of the FPGA register(s) and corresponding binary value(s) to one or more servo FPGA memory interface(s) 660. The servo FPGA memory interface(s) 660 write the values to the memory register(s) in the FPGA 430. In various embodiments, when a high-level query method is called, the servo driver 610 sends a query message containing the address(es) of FPGA memory register(s) to one or more servo FPGA memory interface(s) 660. The servo FPGA memory interface(s) 660 read the values from the register(s) in the FPGA 430 and return the results to the servo driver 610, which converts binary register values into parameter data type(s) and reports the parameter value(s).

Servo control system 600 may interface with users through one or more interfaces, including servo GUI 620, command-line interface 632, and operator interface 634. In various embodiments, command-line interface 632 and operator interface 634 may interface with servo driver 610 through servo RPC server 630. Alternatively, command-line interface 632 and operator interface 634 may interface with servo driver 610 directly. In various embodiments, servo GUI 620, command-line interface 632, and operator interface 634 may operate on computing entity 10 and communicate over network 20 to quantum computer 110, including controller 30, integrated servo system 217, and/or FGPA 430.

Servo GUI 620 may provide a user-friendly interface to provide commands to be executed, such as a graphical user interface. A graphical user interface may provide graphical representation of settings associated with an integrated servo system 217, such as system component settings described herein, which may be generated by the controller 30 and/or the integrated servo system 217. Command-line interface 632 may provide an interface allowing a user to execute one or more commands using commands on a command line, which may be preferred for the execution of one or more routines or subroutines, such as during calibration, diagnosis, or trouble shooting. An operator interface 634 may be used during operation of the quantum computer system. In various embodiments, the servo GUI 620, command-line interface 632, and/or operator interface 634 may display alerts, parameter settings, historical trends, and/or operational parameters. In various embodiments, an operator may use the interfaces to supervise or develop a quantum program, including individually controlling settings of one or more components of the quantum computing system 100, including integrated servo system 217.

In various embodiments, servo driver 610 and servo FPGA memory are located in an integrated servo system 217, such as in a FPGA 430.

The servo control system 600 may be used to adjust settings of one or more components associated with integrated servo systems 217, including signal processing, settings, and/or parameters of filters (e.g., gains, phase, transfer functions, etc.), including or excluding inputs and/or outputs in a closed loop control system (e.g., mixers, splitters, etc.), etc. For example, the Servo GUI 620 may present an operator with control over individual servo channel settings, such as on a display of a computing entity 10.

In various embodiments, RPC server 630 communicates with command-line interface 632 and/or operator interface 634 as well as servo driver 610 to communicate data. In various embodiments, the RPC server 630 may run in tandem with the servo driver 610 on computing entity 10, controller 30, and/or integrated servo system 217. The RPC server 630 may expose high-level servo parameter write and query methods of the servo driver 610 to one or more RPC clients. An operator, through command-line interface 632 and/or operator interface 634, may set or adjust setting or parameters of components of an integrated servo system 217. The RPC server 630 may communicate with command-line interface 632 and/or operator interface 634 over a network 20.

In various embodiments, database writer 640 may write and/or read data from one or more databases, such as time series database 642. In various embodiments, database writer 640 may run in tandem with the servo driver 610 on computing entity 10, controller 30, and/or integrated servo system 217. The servo driver 610 may publish servo parameter values or data received from streaming interfaces 670 to the database writer. Time series database 642 may store time series data associated with control signals, components, historical trends, and/or analysis regarding or performed by an integrated servo system 217.

In various embodiments, servo configuration database 650 may store configurations for an integrated servo system 217 and/or components of an integrated servo system 217 as servo configuration data. In various embodiments, such configuration settings may include calibration settings and/or adjustments, which may be to a specific component, specific components on a servo channel, and/or multiple servo channels, such as components and settings described herein.

In various embodiments, servo FPGA memory interface(s) 660 may include interfaces to write values to particular FPGA memory addresses, which may set and/or adjust settings or parameters, such as with components of one or more servo channels.

In various embodiments, streaming interfaces 670 may be located in a controller 30 and/or an integrated servo system 217, such as in a FPGA 430 or on FPGA PCB 420. Streaming interfaces 670 may be configured to provide a live stream of historical data, trend data, and/or real-time data associated with an integrated servo system 217, a component of an integrated servo system 217, and/or one or more servo channels (collectively, live stream servo data). In various embodiments, such data may include noise, frequency content, trends, alerts, alarms, etc. In various embodiments, streaming interfaces 670 may record data, such as in data objects, which may be provided to memory or databases. In various embodiments, data, such as in a data object, may be provided by the streaming interfaces 670 to control system 680, to servo GUI 620, to command-line interface 632, and/or to operator interface 634. The streaming interface(s) 670 may include one interface or more than one interface, where an interface may be specific to one or more integrated servo systems 217 and/or servo channels. In various embodiments, the streaming interfaces 670 may stream data to or from a time-series database 642, which may include providing data to time-series database 642 to be stored and/or receive data to be visualized along with streaming data. Data visualized may include real-time monitoring of integrated servo system status in addition to data, which may be transmitted to and received by a user device (e.g., computing entity 10) for display to a user. In various embodiments, the data may be indicative if a value of a component in the integrated servo system 217, if the value is at or near a threshold, and/or analysis of the data (e.g., if a component is near a rail and/or there is no additional headroom). In various embodiments, a user may, in response, enter and/or select a setting to adjust and transmit the adjustment to the integrated servo system 217, which would implement the transmitted setting.

Example Process

Having described example system and apparatus architectures in accordance with the present disclosure, example processes in accordance with the present disclosure are described below. It should be appreciated that the processes depicted in each of the following figures may be embodied in any number of ways.

FIG. 7 provides a first example process for closed loop control system in accordance with at least some example embodiments of the present disclosure.

At operation 710, an integrated servo system 217 receives a program. In various embodiments, a program may be received from a computing entity 10, a controller 30, a servo GUI 620, a command-line interface 632, and/or an operator interface 634. In various embodiments, a program may be received at FPGA 430. A program may be a quantum program or a portion of a quantum program specific to an integrated servo system 217.

At operation 720, an integrated servo system 217 generates settings. In various embodiments, the FPGA 430 of an integrated servo system 217 may convert the portion of a program received to specific settings for components associated with the integrated servo system 217. Such settings may include, but are not limited to, gains, phases, filter settings, transfer functions etc. that may be used by an integrated servo system 217 during the execution of one or more operations. In various embodiments where a quantum program 217 may include a plurality of operations for an integrated servo system 217, a plurality of settings may be generating, which may include when to apply settings at specific times in order to execute the plurality of operations of the program. In various embodiments, data indicative of the settings may be stored in a database, such as servo config database 650, which may store the data along with an indicator specifying the program or portion of program received at 710.

At operation 730, an integrated servo system 217 loads settings. In various embodiments, the loading of settings may include loading and/or adjusting settings that were generated in order for the execution of operations at specific periods of time that correspond to some or all of a program. In various embodiments, the settings may be loaded to FPGA memory for use during execution of operations by the programs.

At operation 740, an integrated servo system 217 receives feedback. In various embodiments, when an operation occurs and a closed loop control system control generates feedback, the feedback is received, such as at FPGA 430. The feedback may be generated by one or more sensors associated with the closed loop control system. Additionally or alternatively, feedback may be generated by quantum computer system 100 components not associated with the integrated servo system 217, which may be used as an input for use in analyzing feedback associated with the integrated servo system 217.

At operation 750, an integrated servo system 217 analyzes feedback. In various embodiments, the feedback from a sensor associated with the integrated servo system 217 may be used to determine if adjustments to settings are needed. In various embodiments, adjustments to setting may be to remove noise form one or more components associated with an integrated servo control system 217.

At operation 760, an integrated servo system 217 generate adjustments. In various embodiments, if analysis of the feedback determines adjustments may need to be made, then adjustments may be generated by the integrated servo system 217 and/or by an operator. In various embodiments, an integrated servo system 217 may be configured to dynamically generate adjustments, which may be based on a control signal (e.g., 472) received from a sensor (e.g., 470) as feedback. Additionally or alternatively, a suggestion of an adjustment may be provided to an operator at an interface (e.g., 620, 632, 634) and an operator may enter an adjustment or choose an adjustment from a list of one or more, which may provide the adjustment or may provide an indication of an adjustment to the integrated servo system 217, which may then generate the adjustment. In various embodiments, if no adjust is determined to be needed at operation 750, then an operation may be executed by the quantum computer system 100 without generating an adjustment at operation 760.

In an exemplary embodiment, the process of FIG. 7 may be utilized to calibrate an integrated servo system 217. A user may provide a program or command to calibrate an integrated servo system 217, such as the execution of a calibration routine, which is received by the integrated servo system 217. Alternatively, a controller 30 or the integrated servo system 217 may determine to execute a calibration if it determined a components of the integrated servo system 217, a components of a closed loop control system, or an external signal being monitored were found to generate an error or be out of tolerance or if a certain amount of time had elapsed since the last calibration. A calibration routine may be to determine noise and responses in system components associated the integrated servo system 217, such as AOM 450. The integrated servo system 217 may generate one or more settings associated with the calibration routine that may be loaded to the components (e.g., DDS, mixers, splitters, etc.) of the integrated servo system 217. The calibration routine may then run, including laser 440 generating a laser output 442 to be shaped by AOM 450. The FPGA 430 may output an FPGA output signal 432, which may be generated based on the loaded settings. The execution of the operation may cause sensor 470 to generate a sensor output signal 472 indicative of noise and a non-linear response of the AOM during pulse shaping, which may be received by FPGA 430. The FPGA 430 may analyze the feedback of the sensor output signal 472 to determine adjustments to adjust a setting to cause the AOM to have reduced noise as well as behave in a linear response. That analysis may include generating a plurality of adjustments to be applied iteratively to calibrate the integrated servo system 217 and AOM 450 to generate desired intensity profiles, including pulse shapes. The adjustments may be used to generate settings that are loaded iteratively. With each iteration, the FPGA 430 may use the feedback of sensor output signal 472 to dynamically adjust the settings, such as to compensate for temperature or mechanical noise associated with the iterations.

In an alternative exemplary embodiment, a transfer function associated with a components of a closed loop control system may be determined and an associated integrated servo system 217 may be calibrated. An AOM 450 may be known or may be determined to have a non-linear response, such as with measurements of increasing outputs based on increasing inputs. A sensor output signal 472 may be measured with the increasing inputs into AOM 450, which may also include decreasing inputs, such as to account for hysteresis. The integrated servo system 217, such as with the real-time engine and/or analysis engine, may determine that AOM 450 has a non-linear response and determine a plurality of FPGA output signals 432 that result in AOM 450 providing a linear response.

Conclusion

Although an example system has been described above, implementations or embodiments of the subject matter and the operations described herein can be implemented in other types of digital electronic circuitry, computer software or program, firmware, or hardware, including the structures disclosed in this specification and their structural equivalents, or in combinations of one or more of them.

Embodiments of the subject matter described herein can be implemented as one or more computer programs, i.e., one or more modules of computer program instructions, encoded on computer storage medium for execution by, or to control the operation of, information/data processing apparatus. Alternatively, or in addition, the program instructions can be encoded on an artificially-generated propagated signal, e.g., a machine-generated electrical, optical, or electromagnetic signal, which is generated to encode information/data for transmission to suitable receiver apparatus for execution by an information/data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially-generated propagated signal. The computer storage medium can also be, or be included in, one or more separate physical components or media (e.g., multiple CDs, disks, or other storage devices).

The operations described herein can be implemented as operations performed by an information/data processing apparatus on information/data stored on one or more computer-readable storage devices or received from other sources.

The term "data processing apparatus" as used above encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application-specific integrated circuit). The apparatus can also include, in addition to hardware, code that creates an execution environment for the computer program in question, e.g., code that constitutes processor firmware, a protocol stack, a repository management system, an operating system, a cross-platform runtime environment, a virtual machine, or a combination of one or more of them. The apparatus and execution environment can realize various different computing model infrastructures, such as web services, distributed computing, and grid computing infrastructures.

Computer software or computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A computer program can be stored in a portion of a file that holds other programs or information/data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described herein can be performed by one or more programmable processors executing one or more computer programs to perform actions by operating on input information/data and generating output. Processors suitable for the execution of a computer program include, by way of example, both general and special purpose microprocessors, and any one or more processors of any kind of digital computer. Generally, a processor will receive instructions and information/data from a read-only memory or a random access memory or both. The essential elements of a computer are a processor for performing actions in accordance with instructions and one or more memory devices for storing instructions and data. Generally, a computer will also include, or be operatively coupled to receive information/data from or transfer information/data to, or both, one or more mass storage devices for storing data, e.g., magnetic, magneto-optical disks, or optical disks. However, a computer need not have such devices. Devices suitable for storing computer program instructions and information/data include all forms of non-volatile memory, media, and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, embodiments of the subject matter described herein can be implemented on a computer having a display device, e.g., a CRT (cathode ray tube) or LCD (liquid crystal display) monitor, for displaying information/data to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Embodiments of the subject matter described herein can be implemented in a computing system that includes a back-end component, e.g., as an information/data server, or that includes a middleware component, e.g., an application server, or that includes a front-end component, e.g., a client computer having a graphical user interface or a web browser through which a user can interact with an implementation of the subject matter described herein, or any combination of one or more such back-end, middleware, or front-end components. The components of the system can be interconnected by any form or medium of digital information/data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs running on the respective computers and having a client-server relationship to each other. In some embodiments, a server transmits information/data (e.g., an HTML page) to a client device (e.g., for purposes of displaying information/data to and receiving user input from a user interacting with the client device). Information/data generated at the client device (e.g., a result of the user interaction) can be received from the client device at the server.

While this specification contains many specific implementation details, these should not be construed as limitations on the scope of any disclosures or of what may be claimed, but rather as descriptions of features specific to particular embodiments of particular disclosures. Certain features that are described herein in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. A quantum computer system comprising:

a laser source configured to generate a laser beam;

a modulator configured to receive the laser beam, to receive a servo control signal, and to modulate the laser beam to generate a modulated laser beam based on the laser beam and the servo control signal;

a sensor configured to receive the modulated laser beam, detect an intensity of the modulated laser beam, and generate a sensor control signal based on the intensity of the modulated laser beam;

an integrated servo system, wherein the integrated servo system is configured to:

receive, before a first time period, at least a portion of a quantum program that includes a plurality of operations for the integrated servo system over at least the first time period and a second time period;

generate, based on the at least the portion of the quantum program and before the first time period, two or more settings for one or more components of the integrated servo system including at least a first setting for the first time period and at least a second setting for a second time period;

load, before a start of the first time period, the first setting to the one or more components of the integrated servo system;

receive, during the first time period, the sensor control signal;

produce, for the first time period and based on the first setting and the sensor control signal, the servo control signal for the first time period;

load, before a start of the second time period, the second setting to the one or more components of the integrated servo system;

receive, during the second time period, the sensor control signal; and produce, for the second time period and based on the second setting and the sensor control signal, the servo control signal for the second time period.

2. The quantum computer system of claim 1, wherein the quantum computer system includes a control system chassis, and wherein the integrated servo system is mounted in the control system chassis.

3. The quantum computer system of claim 1, where the integrated servo system is associated with one or more servo channels, and wherein each of the servo channels are on a printed circuit board (PCB).

4. The quantum computer system of claim 1, where the integrated servo system is associated with one or more servo channels, and wherein the servo channels are on a printed circuit board (PCB) and a daughter PCB.

5. The quantum computer system of claim 1, wherein the integrated servo system further comprising:

one or more direct digital synthesis (DDS) devices, wherein each (DDS) device is configured to generate a servo control signal based on a noise measurement from a sensor control signal.

6. The quantum computer system of claim 1, wherein the integrated servo system is further configured to receive servo configuration data from a servo configuration database and to load one or more settings of one or more integrated servo system components with a setting based on the servo configuration data.

7. The quantum computer system of claim 1 further comprising:

a controller configured to live-stream integrated servo system data; and a user device configured to receive integrated servo system data from the live-stream integrated servo system data and display the integrated servo system data.

8. A quantum computer system comprising:

a first laser source and a second laser source, wherein the first laser source is configured to generate a first laser beam and the second laser source is configured to generate a second laser beam;

a first modulator and a second modulator, wherein the first modulator is associated with the first laser source and the second modulator is associated with the second laser source, wherein the first modulator is configured to receive the first laser beam, to receive a first servo control signal, and to modulate the first laser beam to generate a first modulated laser beam based on the first laser beam and the first servo control signal, wherein the second modulator is configured to receive the second laser beam, to receive a second servo control signal, and to modulate the second laser beam to generate a second modulated laser beam based on the second laser beam and the second servo control signal;

a first sensor and a second sensor, wherein the first sensor is configured to receive the first modulated laser beam, detect a first intensity of the first modulated laser beam, and generate a first sensor control signal based on the first intensity of the first modulated laser beam, and wherein the second sensor is configured to receive the second modulated laser beam, detect a second intensity of the second modulated laser beam, and generate a second sensor control signal based on the second intensity of the second modulated laser beam; and a first integrated servo system configured to:

receive, before a first time period, at least a portion of a quantum program that includes a plurality of operations for the first integrated servo system over at least the first time period and a second time period;

generate, based on the at least the portion of the quantum program and before the first time period, two or more settings for one or more components of the first integrated servo system including at least a first setting for the first time period and at least a second setting for a second time period;

load, before a start of the first time period, the first setting to the one or more components of the first integrated servo system;

receive, during the first time period, the first sensor control signal;

produce, for the first time period and based on the first setting and the first sensor control signal, the first servo control signal for the first time period;

load, before a start of the second time period, the second setting to the one or more components of the first integrated servo system;

receive, during the second time period, the first sensor control signal; and produce, for the second time period and based on the second setting and the first sensor control signal, the first servo control signal for the second time period; and a second integrated servo system configured to receive the second sensor control signal and generate the second servo control signal based on the second sensor control signal.

9. The quantum computer system of claim 8, wherein the quantum computer system includes a control system chassis, and wherein the first integrated servo system and second integrated servo system are mounted in the control system chassis.

10. The quantum computer system of claim 8, where the first integrated servo system and second integrated servo system are mounted on one printed circuit board (PCB).

11. The quantum computer system of claim 8, wherein the first integrated servo system further comprising: a first direct digital synthesis (DDS) device, wherein the first DDS device is configured to generate the first servo control signal based on a first noise measurement from a first sensor control signal, and wherein the second integrated servo system further comprising: a second DDS device, wherein the second DDS device is configured to generate the second servo control signal based on a second noise measurement from a second sensor control signal.

12. The quantum computer system of claim 8, wherein the first integrated servo system and the second integrated servo system are further configured to receive servo configuration data from a servo configuration database and to load one or more settings of one or more integrated servo system components with a setting based on the servo configuration data.

13. The quantum computer system of claim 8 further comprising:

a controller configured to live-stream integrated servo system data received from the first integrated servo system and the second integrated servo system; and a user device configured to receive the integrated servo system data from the live-stream integrated servo system data and display the integrated servo system data.

14. A quantum computer system comprising:

an integrated servo system, wherein the integrated servo system is configured to:

receive, before a first time period, at least a portion of a quantum program that includes a plurality of operations for the integrated servo system over at least the first time period and a second time period;

generate, based on the at least the portion of the quantum program and before the first time period, two or more settings for one or more components of the integrated servo system including at least a first setting for the first time period and at least a second setting for a second time period;

load, before a start of the first time period, the first setting to the one or more components of the integrated servo system;

receive, during the first time period, a sensor control signal from a sensor;

produce, for the first time period and based on the first setting and the sensor control signal, a servo control signal for the first time period;

load, before a start of the second time period, the second setting to the one or more components of the integrated servo system;

receive, during the second time period, the sensor control signal; and produce, for the second time period and based on the second setting and the sensor control signal, the servo control signal for the second time period;

transmit a plurality of integrated servo system data settings;

a laser source configured to generate a laser beam;

a modulator configured to receive the laser beam and the servo control signal and to modulate the laser beam to generate a modulated laser beam based on the laser beam and the servo control signal; and a controller comprising the integrated servo system, wherein the controller is configured to transmit the plurality of integrated servo system data settings to a computing entity.

15. The quantum computer system of claim 14, wherein transmitting the plurality of integrated servo system data settings to a computing entity comprises generating a graphical representation of an alert associated with the plurality of integrated servo system data settings and transmitting the alert for display.

16. The quantum computer system of claim 14, wherein the quantum computer system includes a control system chassis, and wherein the integrated servo system is mounted in the control system chassis.

17. The quantum computer system of claim 14, where the integrated servo system is associated with one or more servo channels, and wherein each of the servo channels are on a printed circuit board (PCB).

18. The quantum computer system of claim 14, where the integrated servo system is associated with one or more servo channels, and wherein the servo channels are on a printed circuit board (PCB) and a daughter PCB.

19. The quantum computer system of claim 14, wherein the integrated servo system further comprising:

one or more direct digital synthesis (DDS) devices, wherein each (DDS) device is configured to generate a servo control signal based on a noise measurement from a sensor control signal.

20. The quantum computer system of claim 14, wherein the integrated servo system is further configured to receive servo configuration data from a servo configuration database and to load one or more settings of one or more integrated servo system components with a setting based on the servo configuration data.

21. A quantum computer system comprising:

an integrated servo system, wherein the integrated servo system is configured to:

receive, before a first time period, at least a portion of a quantum program that includes a plurality of operations for the integrated servo system over at least the first time period and a second time period;

generate, based on the at least the portion of the quantum program and before the first time period, two or more settings for one or more components of the integrated servo system including at least a first setting for the first time period and at least a second setting for a second time period;

load, before a start of the first time period, the first setting to the one or more components of the integrated servo system;

receive, during the first time period, a sensor control signal from a sensor, produce, for the first time period and based on the first setting and the sensor control signal, a servo control signal for the first time period;

load, before a start of the second time period, the second setting to the one or more components of the integrated servo system;

receive, during the second time period, the sensor control signal; and produce, for the second time period and based on the second setting and the sensor control signal, the servo control signal for the second time period;

a laser source configured to generate a laser beam;

a modulator configured to receive the laser beam and the servo control signal and to modulate the laser beam to generate a modulated laser beam based on the laser beam and the servo control signal;

wherein the servo control signal is configured to linearize a non-linear response of the modulator.

22. The quantum computer system of claim 21, wherein the servo control signal is determined based at least in part on results of a calibration routine configured to determine the non-linear response of the modulator.

* * * * *